(12) United States Patent
Beernink

(10) Patent No.: US 7,176,543 B2
(45) Date of Patent: Feb. 13, 2007

(54) METHOD OF ELIMINATING CURL FOR DEVICES ON THIN FLEXIBLE SUBSTRATES, AND DEVICES MADE THEREBY

(75) Inventor: Kevin Beernink, Clarkston, MI (US)

(73) Assignee: United Solar Ovonic Corp., Auburn Hills, MI (US)

( * ) Notice: Subject to any disclaimer, the term of this patent is extended or adjusted under 35 U.S.C. 154(b) by 0 days.

(21) Appl. No.: 11/339,764

(22) Filed: Jan. 25, 2006

(65) Prior Publication Data

US 2007/0013019 A1    Jan. 18, 2007

Related U.S. Application Data

(60) Provisional application No. 60/647,140, filed on Jan. 26, 2005.

(51) Int. Cl.
*H01L 31/00* (2006.01)
*H01L 31/042* (2006.01)
*G01R 21/26* (2006.01)

(52) U.S. Cl. .................. 257/439; 438/19; 136/245

(58) Field of Classification Search ............... 257/439; 136/245; 438/19, 48
See application file for complete search history.

(56) References Cited

U.S. PATENT DOCUMENTS

| 4,485,125 | A | | 11/1984 | Izu et al. ...................... 427/74 |
| 4,788,846 | A | * | 12/1988 | Morita et al. .................. 72/160 |
| 5,090,356 | A | | 2/1992 | Nath et al. ................... 118/718 |
| 6,362,020 | B1 | * | 3/2002 | Shimoda et al. .............. 438/62 |
| 6,767,762 | B2 | * | 7/2004 | Guha ........................ 438/113 |
| 6,946,361 | B2 | * | 9/2005 | Takayama et al. .......... 438/455 |
| 2004/0224436 | A1 | * | 11/2004 | Naito ......................... 438/106 |

* cited by examiner

*Primary Examiner*—W. David Coleman
(74) *Attorney, Agent, or Firm*—Gifford, Krass, Groh, Sprinkle, Anderson & Citkowski, P.C.

(57) ABSTRACT

A thin film semiconductor device such as a photovoltaic device is fabricated on a lightweight substrate material which is affixed to a layer of material which is in turn supported by a carrier. Following the fabrication of the device, the carrier is removed such as by an etching process, leaving the layer of material adhered to the substrate. The adhered layer provides a balancing force to the back side of the substrate which minimizes or eliminates the tendency of the semiconductor device supported on the opposite side of the substrate to cause the substrate to curl. Also disclosed are devices and structures made by this method.

20 Claims, 2 Drawing Sheets

METHOD OF ELIMINATING CURL FOR DEVICES ON THIN FLEXIBLE SUBSTRATES, AND DEVICES MADE THEREBY

RELATED APPLICATION

This application claims priority of U.S. Provisional Patent Application Ser. No. 60/647,140 filed Jan. 26, 2005, entitled "Method of Eliminating Curl for Devices on Thin Flexible Substrates, and Devices Made Thereby" which is incorporated herein by reference.

STATEMENT OF GOVERNMENT INTEREST

This invention was made with Government support under Air Force Contract No. F29601-03-C-0122, awarded by the U.S. Air Force. The Government has certain rights in the invention.

FIELD OF THE INVENTION

This invention relates generally to devices such as thin film electronic devices, which are fabricated on thin flexible substrates. More specifically, the invention relates to such devices wherein substrate curl is minimized or eliminated. In particular embodiments, the invention relates to ultra lightweight photovoltaic devices in which substrate curl is minimized or eliminated.

BACKGROUND OF THE INVENTION

Because of concern regarding weight and flexibility, thin film devices including electronic devices such as photovoltaic devices, electrical circuits, electrode structures and the like, as well as non-electronic devices such as filters, catalysts, optical data storage devices and the like, are frequently fabricated on thin, flexible substrates.

The layers of material comprising the active device are frequently deposited by thin film techniques and generally have inherent stresses which cause the thin flexible substrate to curl. Such curling interferes with the use of the device and complicates processing and handling steps. Various techniques have been implemented to eliminate or minimize such curling. In some instances, the material comprising the device is disposed in the form of discrete islands having a relatively small area. However, this approach is not practical for many types of device and requires specialized steps during the deposition process. In other instances, compensating layers having stress in the opposite direction of the direction of curl are deposited onto the front surface of the structure along with the thin film device; however, such layers are not always available, and their disposition can interfere with the function of the device. In other instances, stress compensating layers are deposited on the back side of the substrate opposite the device. While such anti-curl layers are effective, they are not generally compatible with roll-to-roll deposition processes which are frequently employed for the large scale fabrication of thin film ultralight semiconductor devices such as ultralight photovoltaic devices. Such roll-to-roll processes are well known in the art and are disclosed in U.S. Pat. Nos. 4,485,125 and 5,090,356, the disclosures of which are incorporated herein by reference.

In the roll-to-roll fabrication of ultralight, thin film electronic devices such as photovoltaic devices, a thin substrate member is affixed to a carrier member, typically a body of a ferrous alloy material. The carrier member provides mechanical strength and rigidity to the substrate as it is carried through a large scale roll-to-roll processing unit. Furthermore, in some instances the ferrous carrier allows for magnetic handling and guidance of the device during its fabrication and processing. Semiconductor layers are deposited onto the supported substrate, and when device fabrication is finished, the carrier material is removed, typically by etching utilizing an acidic solution such as a solution of ferric chloride. The presence of the carrier member precludes the deposition of a stress compensating layer on the back side of the substrate. The compensating layer could be deposited onto the substrate prior to the time it is affixed to the carrier; however, the thus coated substrate would then tend to curl since stresses generated by the compensating layer are not counterbalanced by stresses generated by the not yet deposited device.

As will be explained in detail hereinbelow, the present invention provides a method and structure which allows stress compensated devices to be fabricated in a roll-to-roll process.

BRIEF DESCRIPTION OF THE INVENTION

Disclosed herein is a method for fabricating a thin film semiconductor device such as a photovoltaic device. According to the method, a carrier member is provided, and a body of a first, stress compensating material is disposed on the carrier. A body of a substrate material is provided, and a first side of the body of substrate material is affixed to the body of first material which is disposed on the carrier. A thin film semiconductor device is fabricated on the second side of the substrate; and thereafter, the carrier is removed from the substrate so that the first material remains affixed to the substrate. In specific embodiments, the carrier member is a metallic material, such as a ferrous material, and the step of removing the carrier comprises etching the carrier away from the first material by the use of an etchant. In some instances, an etch stop layer is interposed between the carrier and the first material. The substrate may comprise a thin body of polymeric material such as a polyimide. In particular instances, the first material is a balancing material which is operative to prevent substrate curl when the second body is deposited thereupon and the carrier is removed. In particular instances, the thin film semiconductor device comprises a thin film photovoltaic device.

In other embodiments, the present invention may be adapted for the fabrication of structures which are not thin film semiconductor devices. Such devices may include filters, optical elements such as holographic optical elements, supported coatings, and other such structures comprising thin film supported upon a relatively thin substrate member. Also disclosed herein are semiconductor devices and other structures fabricated according to the methods of the present invention.

DETAILED DESCRIPTION OF THE INVENTION

According to the method of the present invention, a device comprising a body of material, such as a body of electronic material, disposed upon a thin substrate is fabricated by a process which minimizes or eliminates curl in the finished device. According to the method, a carrier member has a body of a first, stress compensating material disposed thereupon. The material may be deposited by thin film techniques such as sputtering, evaporation or the like, or other physical or chemical deposition techniques may be similarly employed. The substrate material of the device, which is typically a body of thin, polymeric material, is then affixed to the body of first material which is disposed upon the substrate. Such affixation may be accomplished by adhesive bonding, electrostatic bonding, thermoplastic bonding or the like. In subsequent steps, the device in question is fabricated upon this supported substrate. Such fabrication steps may include the deposition of one or more layers of thin film material such as semiconductor materials, oxides, electrode materials, protective layers and the like. Following the completion of the fabrication of the device, the carrier member is then stripped away from the substrate leaving the body of the first material behind, and such material functions as a stress compensating layer balancing stresses in the deposited device so that the resultant device exhibits minimal, or no, substrate curl.

The methods of the present invention may be utilized for the fabrication of a wide variety of devices, as will be readily apparent to one of skill in the art. As such, the carrier member, compensating material, and substrate material may be selected from a variety of materials known to those of skill in the art.

One embodiment of the present invention will be described with reference to the fabrication of a thin film photovoltaic device comprised of a plurality of layers of thin film photovoltaic material such as group IV alloy materials, and associated reflector, electrode, and current collecting structures. It is to be understood that the disclosed method may likewise be adapted for the manufacture of other thin film electronic devices such as displays, photoreceptors, memory arrays, circuits and the like.

Figure 1:
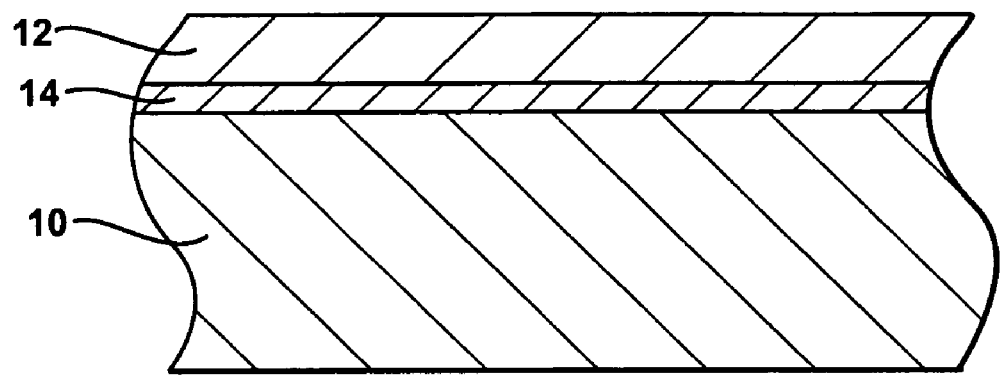
FIG. 1 is a cross-sectional view of a carrier member having an etch stop layer and a body of a first material deposited thereupon in accord with the present invention.

FIG. 1 illustrates the first step in the method of the present invention. Shown therein in cross section is a carrier member 10 with a body of a first material 12 disposed thereupon. As specifically illustrated in FIG. 1, a body of an etch stop material 14 is interposed between the carrier 10 and the body of first material 12. It should be noted that for purposes of illustration, thicknesses of the materials 12 and 14 have been exaggerated. In a typical application for the fabrication of a thin film photovoltaic device, the carrier member 10 comprises a body of a ferrous material such as magnetic stainless steel. The thickness of the carrier member 10 will depend upon processing steps which will subsequently be implemented. In one particular application for the roll-to-roll fabrication of photovoltaic devices, carrier members having a thickness of approximately 0.005 inch are utilized. It is to be understood that in other embodiments, carrier members may be fabricated from other materials including other metals as well as polymers, composites, inorganic materials and the like.

In the specific process herein discussed, subsequent removal of the carrier 10 will take place by chemical etching, and for that reason, an etch stop layer 14 is disposed directly atop the carrier 10. In those instances where the carrier 10 is a ferrous material, etching may be advantageously carried out by the use of a mildly acidic material such as a ferric chloride solution, and the etch stop layer may comprise a layer of etch-resistant material such as titanium, molybdenum, tungsten or the like. In other instances, the etch stop material may comprise a polymer or other organic material. In the specific process disclosed herein, the etch stop layer 14 is comprised of titanium and has a thickness of approximately 150 nm. This layer 14 may be deposited atop the carrier 10 by vacuum deposition processes such as evaporation or sputtering as well as by plating, chemical deposition, or any other process known in the art.

As shown in FIG. 1, a body of a first material 12 is supported by the carrier 10, and is disposed directly atop the etch stop layer 14. In this particular embodiment, the body of first material 12 is comprised of zinc oxide (ZnO) and has a thickness of approximately 500 nm. This first material will, in the finished device, serve to balance any tendency of the device to curl as a result of stresses generated by subsequently deposited layers. The first material 12 is deposited upon the carrier by sputtering, evaporation, plasma deposition, or other such vacuum deposition processes, and as such may be readily implemented into a roll-to-roll deposition process. As will be appreciated by those of skill in the art, other layers of material may be likewise employed, and the selection of particular layers will depend upon the nature of subsequently deposited materials.

Figure 2:
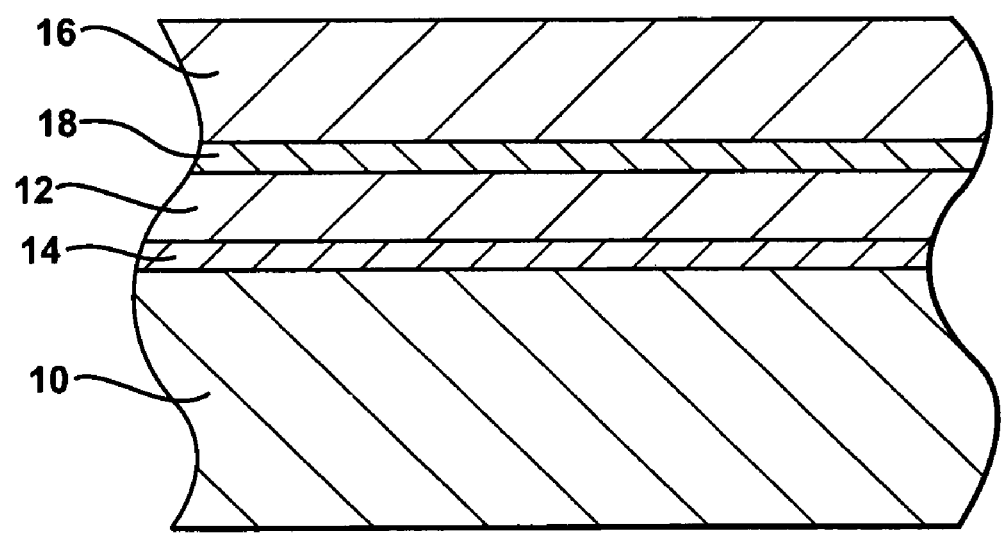
FIG. 2 is a cross-sectional view of the carrier and associated layers of FIG. 1 having a substrate material adhesively affixed thereto.

In a subsequent step, a substrate member is affixed to the carrier, atop the body of first material. Referring now to FIG. 2, there is shown a cross-sectional view of the assembly of carrier 10, etch stop layer 14, and body of first material 12, further including a substrate member 16 affixed thereto by means of a body of adhesive 18. In the illustrated embodiment, as adapted for the manufacture of an ultra lightweight photovoltaic device, the substrate 16 comprises a thin layer of a polyimide polymer. It has been found that materials of this type have very good thermal and dimensional stability. Other polymers with similar properties may be likewise substituted. In the illustrated embodiment, the thickness of the substrate 16 is approximately 1 mil. As shown, the substrate 16 is adhered to the free surface of the body of first material 12 by use of an adhesive. One particular class of adhesives which may be so employed comprises a thermoplastic or hot melts, although other types of adhesive materials including curable adhesives could likewise be utilized.

In some instances, the substrate member may be otherwise affixed to the body of first material. For example, the substrate member may be melt cast onto the body of first material, or it may be solvent coated onto the first material. In yet other instances, the substrate may be laminated thereto by the use of heat and pressure. It will be appreciated by those of skill in the art that yet other techniques for the disposition of the substrate may be employed. For example, the substrate material may be in situ polymerized onto the first material or otherwise deposited. In any instance, the method of the present invention, at this stage, has provided a substrate which is disposed upon a layer of a first material which in turn is supported by a carrier.

Figure 3:
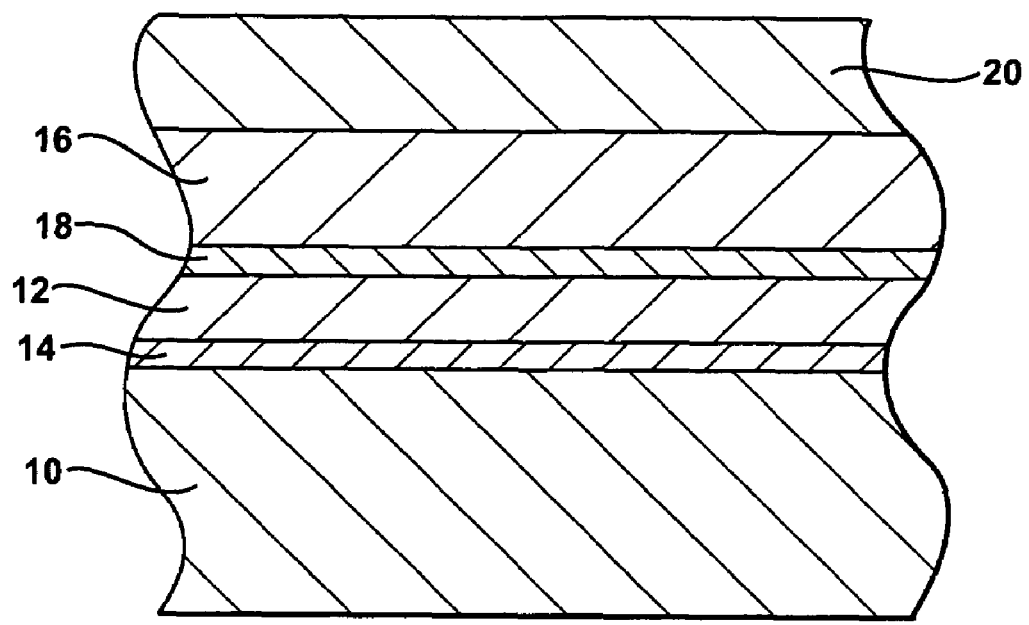
FIG. 3 is a cross-sectional view of the construction of FIG. 2 showing a body of photovoltaic layers disposed upon the substrate.

FIG. 3 illustrates the next stage in the processing of the thin film photovoltaic device. As shown therein, a plurality of photovoltaic cell layers 20 is disposed upon the substrate 16. The photovoltaic layers 20 cooperate to provide a photovoltaic device which, when exposed to light, is operative to generate a flow of electrical current. As such, the photovoltaic layers 20 will include a plurality of semiconductor layers, electrode layers, current collecting structures and the like, and may further include other operative layers such as reflector layers, texturizing layers, antireflective coatings, encapsulant layers and the like as is known in the art. The principles of the present invention may be employed to fabricate a variety of differently configured ultra lightweight photovoltaic devices.

In one particular group of embodiments, the photovoltaic devices comprise thin film devices fabricated from group IV semiconductor alloy materials including hydrogenated silicon alloy materials, hydrogenated silicon-germanium alloy materials and/or hydrogenated germanium alloy materials. In specific instances, the photovoltaic devices are of n-i-p configuration wherein the active semiconductor body of the device includes at least one triad of substantially intrinsic semiconductor material interposed between oppositely doped layers of semiconductor materials. In particular instances, a plurality of such triads are stacked in an optical and electrical series relationship. The photovoltaic device will typically include a bottom electrode layer which functions as one current collector of the device, and a top electrode layer, typically fabricated from a transparent, electrically conductive material. Current collecting structures such as grids, bus bars, and the like are disposed upon one of the surfaces of the device and are in electrical communication with a second electrical terminal of the device. It is to be understood that the principles of the present invention may be implemented in connection with other types and configurations of photovoltaic devices, as well as with other semiconductor devices as noted herein.

Figure 4:
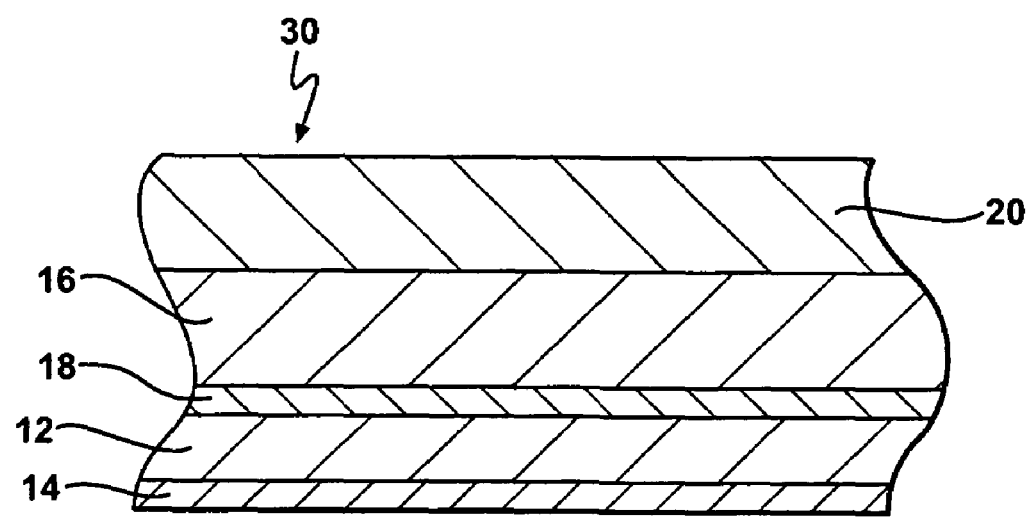
FIG. 4 is a cross-sectional view of a lightweight thin film photovoltaic device comprising the assembly of layers of FIG. 3 following removal of the carrier member.

Referring now to FIG. 4, there is shown a cross-sectional view of a completed, ultra lightweight photovoltaic device 30 fabricated according to the principles of the present invention. The device 30 was fabricated from the structure of FIG. 3 by removal of the body of carrier material therefrom. As such, the device includes the photovoltaic body 20, the substrate 16, an adhesive layer 18, the body of first material 12, and the etch stop layer 14.

In the illustrated embodiment, the carrier 10 comprised a body of steel, and was removed by etching with a ferric chloride solution. The etch stop layer 14 is comprised of titanium, and was not significantly etched by the ferric chloride solution and served to protect the remaining layers of the device from the etchant. As is explained hereinabove, the carrier layer may be otherwise configured and/or otherwise removed. For example, the carrier layer may comprise a body of polymeric material which is subsequently dissolved away by an appropriate solvent. In such instance, an etch stop layer may not be required. In other instances, the carrier body may have a release layer interposed between it and the body of first material. The release layer may comprise a polymeric material, an adhesive, a meltable material or the like, and this release layer is operable to allow the carrier to be removed without etching or dissolution.

In the FIG. 4 embodiment, a body of the first material 12, and in some instances the etch stop material 14, operate to balance forces or strains imposed on the substrate 16 by the photovoltaic body 20 and thereby prevent curling of the substrate. In a series of experiments, photovoltaic devices prepared upon a 1 mil thick polyimide substrate, without the use of the method of the present invention, readily assumed a rolled configuration having a diameter of approximately 1 cm. In contrast, comparable devices produced through the use of the present invention, and incorporating an approximately 500 nm thick ZnO layer together with an approximately 150 nm thick Ti etch stop layer, did not manifest any appreciable curling.

The present invention is readily adaptable to a roll-to-roll, high volume, high speed process. For example, a roll of stainless steel carrier material may be coated with an etch stop layer and a stress balancing layer in a high speed vacuum coating process. This material may then be continuously laminated to a web of substrate material and directly conveyed to a series of deposition chambers for the fabrication of thin film photovoltaic devices thereupon. At this point, the stock material may be cut to length and further processed into devices by affixation of terminals, protective layers and the like thereto, after which the carrier may be removed. Alternatively, the carrier may be removed in a continuous process to produce a roll of stock material which may be subsequently processed. In either instance, the carrier provides rigidity and protection to the device during fabrication, and the presence of the anti-curl, balancing layer simplifies and facilitates handling and usage of the ultra lightweight material.

As discussed hereinabove, the foregoing principles and processes may be utilized for the fabrication of other lightweight semiconductor devices. Also, the principles may be extended to non-semiconductor device applications where it is necessary to employ relatively thin substrates which have optical and/or electronic layers on both sides, in a process which requires that the substrate be supported on a relatively robust carrier. Such applications will include high speed and/or high volume fabrication of coated stock such as materials used in optical filters, multi-layer electronic materials, specialized membrane materials and the like.

It will be understood that the foregoing discussion, illustrations, examples and drawings are illustrative of specific embodiments of the present invention, but they are not meant to be limitations upon the practice thereof. Numerous modifications and variations will be readily apparent to those of skill in the art in view thereof. It is the following claims, including all equivalents, which define the scope of the invention.

The invention claimed is:

1. A method of fabricating a thin film semiconductor device, said method comprising the steps of:
    providing a carrier member;
    disposing a body of a first material on said carrier;
    providing a body of a substrate material;
    affixing a first side of said body of substrate material to the body of first material disposed on the carrier;
    fabricating a thin film semiconductor device on the second side of said substrate; and
    removing the carrier from the substrate so that the body of first material remains affixed to the substrate.

2. The method of claim 1, wherein the step of affixing the substrate to the body of first material comprises adhesively affixing the substrate thereto.

3. The method of claim 1, wherein the step of removing the carrier member comprises etching away the carrier member with an etchant material.

4. The method of claim 3, including the further step of disposing a body of etch stop material, which is resistant to said etchant, between said carrier and said body of first material.

5. The method of claim 1, wherein said substrate comprises a body of polymeric material having a thickness in the range of 0.5–2 mils.

6. The method of claim 5, wherein said polymeric material is a polyimide.

7. The method of claim 1, wherein said semiconductor device comprises a thin film photovoltaic device.

8. The method of claim 1, wherein said carrier comprises a body of a ferrous material and said step of removing said carrier comprises etching said ferrous material with an acidic etchant.

9. The method of claim 1, wherein said first material is a balancing material operative to prevent substrate curl when the thin film semiconductor device is deposited on the substrate and the carrier is removed.

10. The method of claim 1, wherein said body of a first material has a thickness in the range of 100–500 nanometers.

11. A thin film semiconductor device made by the method of claim 1.

12. A method for fabricating a structure comprising a substrate having a first body of material disposed on a first side thereof and a second body of material disposed on a second side thereof, opposite said first side, said method comprising the steps of:
providing a carrier member;
disposing a body of a first material on said carrier member;
providing a body of a substrate material;
affixing a first side of said body of substrate material to the body of first material which is disposed on the carrier;
depositing a body of a second material on a second side of the substrate; and
removing the carrier from the substrate so that the first body of material remains affixed to the substrate.

13. The method of claim 12, wherein the step of removing the carrier comprises etching the carrier away from the remainder of the structure.

14. The method of claim 12 including the further step of disposing an etch stop layer on the carrier beneath the body of first material.

15. The method of claim 12, wherein said first material is a balancing material operative to prevent substrate curl when the second body is deposited thereupon and the carrier is removed.

16. The method of claim 12, wherein said second body includes at least one layer of a semiconductor material.

17. The method of claim 12, wherein said substrate is comprised of a polymeric material.

18. An ultra lightweight, thin film photovoltaic device comprising:
a substrate comprising a sheet of a polymeric material having a thickness of no more than 3 mils;
a body of thin film photovoltaic material disposed on a first surface of the substrate, said body including at least one triad comprised of a layer of substantially intrinsic group IV semiconductor alloy material interposed between oppositely doped layers of semiconductor material, said photovoltaic body having stresses therein which operate to bias said substrate to a curled configuration; and
a balancing layer disposed on a second surface of the substrate, said biasing layer having stresses therein which impose a biasing force on said substrate which at least partially oppose and cancel the stresses in said photovoltaic body which bias the substrate to the curled configuration; whereby curling of the substrate is at least partially eliminated.

19. A roll-to-roll deposition process for the fabrication of a thin film photovoltaic device, said method comprising the steps of:
providing an elongated web of a carrier material;
disposing a layer of a first material on said web;
providing a body of a substrate material;
affixing said substrate material to said web, atop said layer of said first material, so as to provide a supported substrate;
disposing said supported substrate in a roll-to-roll deposition apparatus;
depositing a plurality of layers of photovoltaic semiconductor material upon said supported substrate in said roll-to-roll deposition apparatus; and
removing the carrier from the substrate so that the body of first material remains affixed to the substrate.

20. The method of claim 19, including the further step of disposing a layer of an etch stop material upon the web of carrier material prior to the step of disposing the layer of first material on said web, and wherein said first material is disposed upon said layer of etch stop material.

* * * * *